United States Patent [19]

Solie

[11] Patent Number: 4,849,760

[45] Date of Patent: * Jul. 18, 1989

[54] SURFACE ACOUSTIC WAVE DOPPLER DETECTOR

[75] Inventor: Leland P. Solie, Mahomet, Ill.

[73] Assignee: Unisys Corporation, Blue Bell, Pa.

[*] Notice: The portion of the term of this patent subsequent to Jan. 6, 2004 has been disclaimed.

[21] Appl. No.: 123,466

[22] Filed: Nov. 20, 1987

[51] Int. Cl.[4] .............................................. G01S 13/58
[52] U.S. Cl. ...................................... 342/104; 342/160
[58] Field of Search .................. 342/104, 28, 114, 160

[56] References Cited

U.S. PATENT DOCUMENTS

| | | | |
|---|---|---|---|
| 4,053,889 | 10/1977 | Johnson | 342/201 |
| 4,167,737 | 9/1979 | Freedman | 342/201 |
| 4,518,256 | 5/1985 | Schwartz | 356/5 |
| 4,523,196 | 6/1985 | Gieraths | 342/172 |
| 4,531,195 | 7/1985 | Lee | 364/822 |
| 4,552,456 | 11/1985 | Endo | 356/5 |
| 4,635,008 | 1/1987 | Solie | 333/195 |
| 4,666,295 | 5/1987 | Duvall, III et al. | 356/5 |
| 4,682,174 | 7/1987 | Richmond et al. | 342/160 |
| 4,715,707 | 12/1987 | Reynolds, III et al. | 356/28.5 |

*Primary Examiner*—Thomas H. Tarcza
*Assistant Examiner*—John B. Sotomayor
*Attorney, Agent, or Firm*—Glenn W. Bowen; Robert S. Bramson

[57] ABSTRACT

A surface acoustic wave (SAW) radar doppler shift detection system is provided by transmitting a modulation signal having an up-chirp component followed by a downchirp component from a dispersive array SAW assembly to a target, and then receiving the radar return from the target by a receiver which also employs a similar dispersive array assembly. Dispersive array assemblies are constructed with two in line dispersive arrays. The dispersive arrays of the transmitter is positioned relative to two input SAW transducers and two output SAW transducers such that a pulse signal supplied to the two input transducers results in an expanded signal of the output transducers. The expanded signal acts as a modulation signal which is multiplied by an RF and transmitted. The receiving array assembly detects the radar return signal, and, after it is multiplied down to the SAW frequency, compresses it. When the target is stationary relative to the transmitter and receiver platform, a single envelope will be detected which indicates that no doppler shift has occurred. When there is relative motion between the target and the platform, the spacing between two detected envelopes, and their relative shifts, is measured and utilized to provide an indication of the magnitude and direction of the doppler shift. The transducers of the array assembly are formed of hyperbolically shaped fingers to provide a wideband range of frequencies.

3 Claims, 2 Drawing Sheets

SURFACE ACOUSTIC WAVE DOPPLER DETECTOR

BACKGROUND OF THE INVENTION

The present invention is related to doppler detection from a radar return and, in particular, to the measurement of a single radar return instead of multiple returns to obtain doppler information. The invention is implemented with dispersive Surface Acoustic Wave (SAW) filters using tapered transducers.

U.S. Pat. No. 4,635,008, issued Jan. 6, 1987, entitled "Dispersive SAW Filter with Tapered Transducers," which was invented by the inventor of the present invention and is assigned to the assignee of the present invention, describes a unique single array dispersive SAW filter. This SAW filter employs input and output transducers which are aligned with respect to the array so that the angle of incidence of a SAW from the input transducer is approximately equal to the angle of reflection from the reflective array, over the entire frequency range of the dispersive array. The input and output transducers are constructed to provide a wide band frequency response which is matched to the periodicity of the dispersive array. In the preferred embodiment of the design, the transducers are formed with hyperbolically curved electrode fingers.

The dispersive SAW filter of U.S. Pat. No. 4,635,008 may be implemented as either an "up-chirp" or a "down-chirp" filter. When an up-chirp filter is implemented, the filter provides a rising time delay versus frequency characteristic, whereby high frequencies are delayed for a greater period of time than are low frequencies. If the time delay decreases as the frequency of the applied signal increases, the filter is a down-chirp filter.

SUMMARY OF THE INVENTION

Dispersive SAW filter with input and output transducers that have hyperbolically-tapered fingers are employed in a doppler shift radar system. The dispersive filter arrays and the tapered transducers are preferably of the type shown in U.S. Pat. No. 4,635,008, but in the present invention an up-chirp and a down-chirp filter are both implemented in a single device. A linear phase delay is obtained in order to generate compressed pulses from a radar return. The separation of two pulse envelopes in time is proportional to the doppler shift of the radar return. The two compressed pulses move apart with increasing doppler shift, and together with a decreasing doppler shift, which allows doppler information to be separated from range information of the single radar return signal.

BRIEF DESCRIPTION OF THE DRAWINGS

The present invention is illustrated by reference to the drawings in which.

TECHNICAL DESCRIPTION OF THE INVENTION

Figure 1:
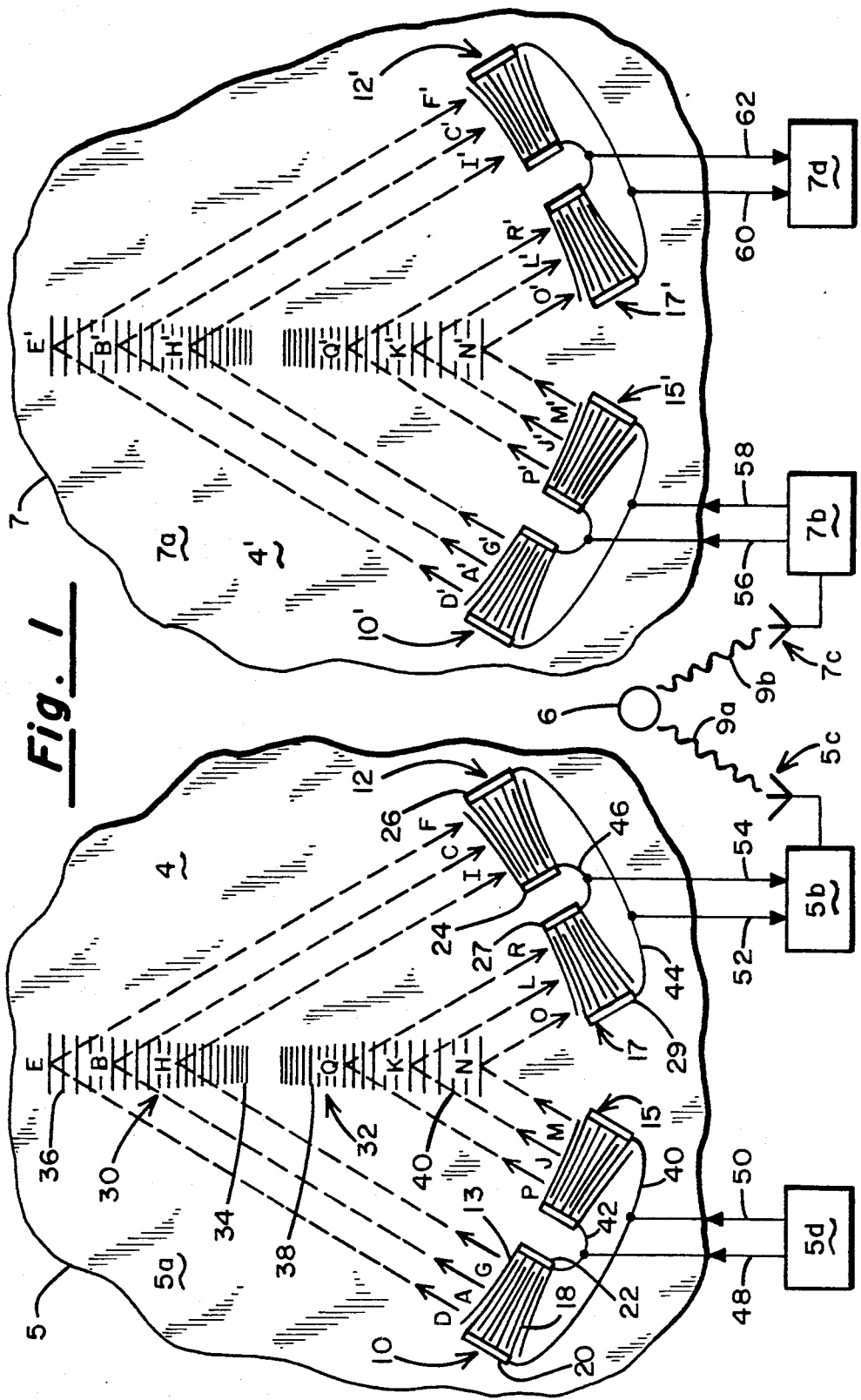
FIG. 1 is an overall schematic representation of a system constructed in accordance with the present invention that uses a transmitter and a receiver to detect doppler shifts of a radar return from a target.

The relative motion of a target with respect to a radar transmitting source is determined by the measuring system of the present invention in which a radar transmitter and a radar detector are constructed in accordance with the present invention. The system consists of a transmitter 5 and a receiver 7 which are located on the same platform. The transmitter 5 includes a dispersive array assembly 5a which is utilized to provide a modulation signal which consists of an up-chirp component followed by a down-chirp component.

This modulation signal is multiplied by an RF signal in the output stage 5b of the transmitter. The resulting signal is sent to the transmitting antenna 5c. The source of the energy for generating the modulation signal is provided by the pulse generator 5d. The transmitted signal 9a strikes the target 6 and is reflected from the target as indicated by the reflected signal 9b. If the target 6 is moving toward or away from the platform, there will be a doppler shift in the reflected signal 9b which will indicate the relative motion and velocity of the target 6.

The reflected signal 9b is received by the receiver 7 on a receiving antenna 7a which couples the signal to the front end 7b of the receiver, which multiplies the received signal down to the appropriate Surface Acoustic Wave (SAW) frequency. The receiver includes a SAW dispersive array assembly 7a, which is identical to the transmitting dispersive array assembly 5a. The resulting output signal from this array is supplied to the measuring unit 7d, which measures the doppler shift of the received signal.

The SAW dispersive array assembly 5a is implemented on a suitable substrate areas 4 and 4' which may be a piezoelectric acoustic-wave-propagating medium, or other substrate suitable for the purpose. Preferably substrate areas 4 and 4' are on a single piezoelectric slab. Two reflective dispersive arrays 30, 32 are implemented on the substrate. These dispersive reflective arrays consist of a number of parallel lines that may be formed either by depositing either metal conductive strips, or by trenches or grooves, that are formed in the substrate. The spacing between the conductive strips, or grooves varies linearly along the array, therefore, the group of strips 34 at one end of the array 30 are spaced close together while the group of strips 36 at the other end of the array are spaced farther apart. In a similar manner in the array 32, the group of strips 38 are spaced closer than are the group of strips 40 at the opposite end of the array. Thus, the group of strips 34 of the dispersive array 30 and the group of strips 38 of the dispersive array 32 form the high frequency ends of the respective arrays 30, 32. The group of strips 36 and the group of strips 40 at the opposite ends of the arrays 30, 32 form the low frequency ends. This means that the refection of high frequency SAWs preferentially occurs at the ends 34, 38, and the lower frequency SAWs are preferentially reflected from the ends 36, 40 when the dispersive reflective arrays 30, 32 are in linear alignment with each other, as shown in FIG. 1.

Four transducers, each of which have tapered interdigital electrode fingers, such as the fingers 13 and 18 of the transducer 10, respectively extend from the relatively short electrode, such as the electrode 22, and the relatively long electrode, such as the electrode 20. The fingers are preferably hyperbolically curved in accordance with the teaching of U.S. Pat. No. 4,635,008. The transducers 10, 15 are input transducers, while the transducers 12, 17 are output transducers. The input transducers 10, 15 are connected in parallel by the interconnection lines 40, 42. The interconnecting lines 40 and 42 are connected to the drive lines 48, 50 which are supplied a continuous periodical source of pulses from the pulse generator 5d. The input transducers 10, 15 receive these input pulses and convert them into SAW waves which travel on the surface 4. These relatively narrow input pulses are converted into a broader frequency spectrum and, therefore, the transmitting transducers 10, 15, which result in a modulated signal expansion at the output transducer 12, 17. The dispersive array assembly 5a is, therefore, collectively called a pulse expander.

The output transducers 17, 21 may be connected in parallel, such as by the interconnection lines 44, 46 as shown in the Figure, or in antiparallel in which the short electrode of one transducer will be connected to the long electrode of the other transducer. The connection of the output transducers of the dispersive array assembly 5a of the transmitter in either parallel or antiparallel only affects the phase shift of the resulting output signal, but does not affect the ultimate operation of the detector. The output transducers 12, 17 are positioned with their short electrodes adjacent each other, such as the electrodes 24, 27, and their longer electrodes 26, 29 are more remote. Therefore, both the input and the output transducers of the dispersive array assembly 5a have their high frequency ends adjacent each other.

The input and output transducers of the dispersive array assembly 5a are positioned with respect to the dispersive array 30, 32 so that SAWs launched by the transducers 10, 15 will contain a range of frequencies each of which is determined in accordance with its launching point on the hyperbolic transducer. The input transducer 10, for example, will transmit an intermediate frequency to the dispersive array 30 along the line A-B, where the SAW will be reflected and directed to the output transducer 12 along the line B-C. The same transducer will provide a higher frequency signal to the output transducer 12 along the lines G-H-I. A lower frequency signal will be provided to the output transducer 12 along the lines D-E-F. Since it takes a shorter time for a SAW to travel along the line G-H-I to reach the output transducer 12 than it does for the lower frequency SAW to travel along the line D-E-F, it is apparent that the downwardly sloping line 78 labelled down-chirp in FIG. 2 represents the frequency versus time characteristic of the SAW signals transmitted by the input transducer 10 to the output transducer 12.

Figure 2:
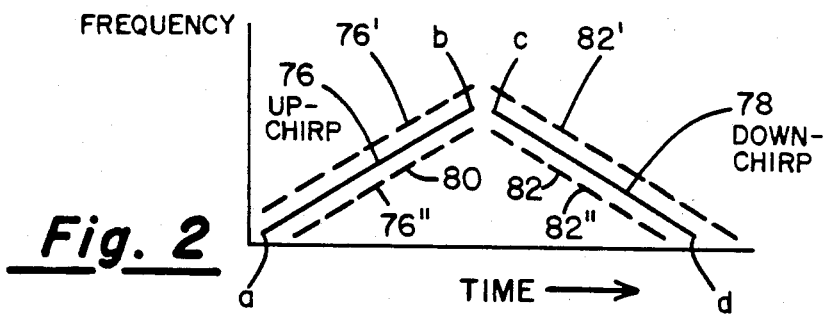
FIG. 2 is a graph which shows the frequency versus time response of both the up-chirp filter and the down-chirp filter of the system.

Correspondingly, the combination of the input transducer 15 and the output transducer 17 provides a up-chirp combination which represented by the line 76 in FIG. 2. This is because the intermediate frequency path J-K-L takes a longer time to reach the output transducer 17 than does the low frequency signal along the path M-N-O. The high frequency signal along the path P-Q-R takes an even longer time to reach the output transducer 17 at the intermediate frequency signals. Since the path P-Q-R is still shorter than the path G-H-I, the line 76 is closer to the origin than the line 78. Additional operating and construction features of a suitable dispersive array filter may be found in U.S. Pat. No. 4,635,008, and this patent is hereby incorporated by reference into this document.

Figure 3:
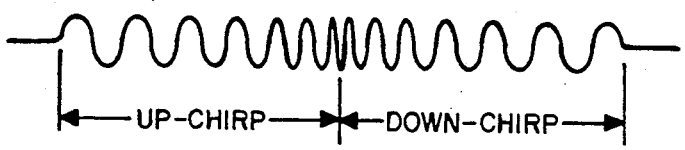
FIG. 3 is a representation of the modulation wave for the radar transmission signal in which an up-chirp component is immediately followed by a down-chirp component.

The wideband relatively low loss signal, provided by the output transducers 12, 17, which is coupled on the lines 52, 54 to the output stage 56, is a modulated signal that has the components illustrated in FIG. 3. Because of the frequency versus time relationship shown in FIG. 2, it is seen that a signal in which the frequency continually varies from a low frequency to a higher frequency (up-chirp) and from the higher frequency back down to the lower frequency (down-chirp). This modulation signal is multiplied up to an RF signal in the output stage 5b of the transmitter, and, as previously mentioned, is transmitted by the antenna 5c to be reflected from the target 6.

The up-chirp and down-chirp filters of the system are designed to have equal and opposite chirp slopes. This is required since the SAW receiving dispersive array assembly 7a will utilize the received signal and compress it to a pair of output pulses. Thus, just as the transmitter SAW dispersive array assembly 5a operates as a pulse expander, the receiver dispersive array assembly 7a acts as a pulse compressor. All of the components of the assembly 7a are constructed in the same manner as those of the assembly 5a. Therefore, all of the element numbers and the element identification letters are labelled the same in both Figures, except that they are primed in the assembly of the receiver 7a.

The input lines 56, 58 from the receiver input stage 7b, which are coupled to the input transducers 10', 15' and the output lines 60, 62 which are connected to the output transducers 12', 17' provide compressed output pulses. The resulting demodulated signal that is supplied to the input transducers 10', 15' from the output stage 7b will have the same frequency components as the transmitted signal if the target 6 is stationary.

Returning again to FIG. 2, the point "a" represents the lowest frequency of the up-chirp component, while the point "b" represents the highest frequency of the up-chirp component. The point "c" represents the highest frequency of the down-chirp component and the point "d" represents the lowest frequency of the down-chirp component. It is seen when the signal of FIG. 3 is supplied to the input transducers 10', 15' of the receiver filter assembly 7a that the first frequency which will be supplied to the input transducers 10', 15' will the frequency at point "a" of the up-chirp component. The receiver input stage 7b supplies the input signals on the lines 56, 58 to the input transducers 10', 15'.

Since the frequency at point "a" is the lowest frequency of the up-chirp component, it is responsible for generating a low frequency SAW component along the lines D'-E'-F' to the output transducer 12'. The frequency at point "b" is correspondingly responsible for providing the high SAW component G'-H'-I' to the output transducer 12'. Thus, the lowest frequency component which arrives first at the input transducer 10' is delayed the longest time in reaching the output transducer 12', while the highest frequency component is delayed the shortest time. The result of this is that narrow pulses of energy are received at the output transducers 12′, 17′ in which all of the frequencies of the up-chirp component from the frequency at point "a" to the frequency at point "b" supply substantially equal contributions.

In a similar manner, when the subsequent down-chirp component occurs, the lowest frequency component at point "c" of the down-chirp component will be supplied by the input transducers 10′, 15′ along the lines M′-N′-0′. Thus, it will arrive sooner at the output transducers 12′, 17′ than the high frequency SAW component along the line P′-Q′-R′, which corresponds to the frequency at the point "d." Therefore, the frequency at the point "c" will take a shorter time to arrive at the output transducers 12′, 17′ than the frequency at the point "d." However, the frequency at the point "c" is transmitted from the transducers 10′, 15′ before the frequency at the point "d" which results in pulse compression. The compressed signal is then transmitted on the lines 60, 62 to the measuring unit 7d.

Figure 4A:
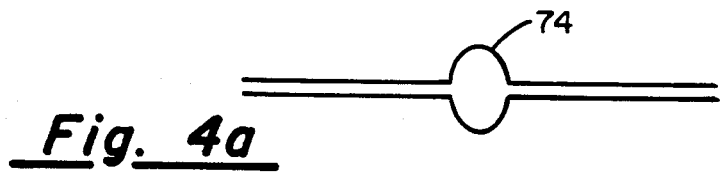
FIG. 4a shows the envelope of the single peak output signal from the doppler detector when no doppler shift is present.
Figure 4B:
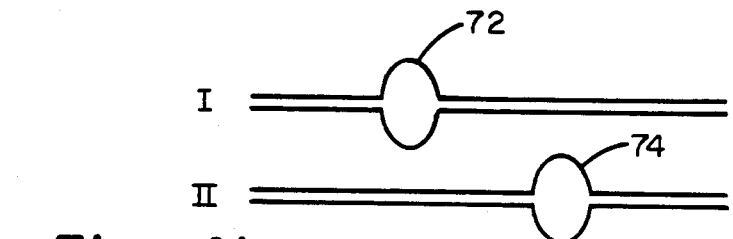
FIG. 4b shows the envelope of the two peak output signal when there is positive doppler shift detected from the return from the target.
Figure 4C:
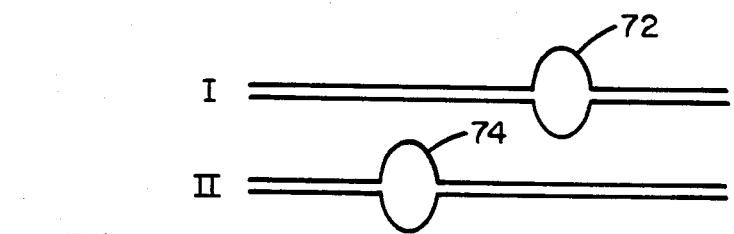
FIG. 4c shows the envelope of the two peak output signal of the detector when a negative doppler shift is detected.

By controlling the configuration of the dispersive array assemblies 5a and 7a, an RF signal which an envelope 74, as shown in FIG. 4a, is transmitted to the measuring unit 7a when the target 6 is stationary. When the target 6 is moving in a direction toward or away from the detecting system, two separate RF signals with envelopes 72, 74 will be produced, as shown in FIGS. 7b and 7c, in which the relative direction of shift indicates if the target 6 is moving toward or away from the platform, and the magnitude of the shift is an indication of the relative velocity of the target. The doppler shift effect causes the up-chirp signal to appear as if it has less of a delay and the down-chirp as if it had more of a delay when the doppler shift is in one direction (as indicated by lines 76′, 82′ in FIG. 2), and when the doppler shift is in the opposite direction so the up-chirp filters appear like it has more of a delay and the down-chirp component as if it had less of a delay (as indicated by dotted lines 80″, 82″ in FIG. 2).

In addition to the desired pulse compressed signals, spurious signals are produced, but these will be at a lower amplitude than the compressed pulse signal and they will be spread in time. For example, energy from the frequency at point "a" supplied to the input transducers 10′, 15′ provides a low frequency component along the lines M′-N′-O′, and energy from the frequency at point "b" provides a high frequency component along the lines P′-Q′-R′ which arrives after the low frequency components. The frequency component at point "a" is also transmitted before the frequency component at point "b". These spurious signals are, therefore, spread in time, and will correspondingly be suppressed on the order of $(3+10 \log N)$dB, where N is the time bandwidth product of the chirp filters. The frequency component at the points "c" and "d" also provides a spreaded signal with spurious components in a similar manner since the frequency at point "c" is associated with the line G′H′I′ and the frequency at point "d" is associated with the line D′E′F′, and the frequency at point "c" is also transmitted before the frequency at point "d." These signal components are termed double expanded signals and may be processed out of the resulting signal by techniques well known to those skilled in the art.

I claim:

1. A device for detecting the doppler shift of a radar return from a target comprising
   transmitter means comprising a first dispersive array assembly means for transmitting an R.F. signal from said transmitter which is modulated by the output signal of said first dispersive array assembly, and
   receiver means comprising a second dispersive array assembly means for down-converting said transmitted RF signal after it is altered by striking a target, and for transmitting said down-converted signal to said second dispersive array,
   wherein said transmitter and receiver array assembly means each comprise colinear first and second dispersive arrays, first and second input transducers for receiving electrical input drive signals, first and second output transducers and a SAW conducting medium adjacent said dispersive arrays and wherein said transducers, and dispersive arrays are all constructed to have frequency-variable varying characteristics from a low frequency end to a high frequency end, said dispersive arrays being oriented such that said second dispersive array is more remote from said transducers than is said first dispersive array and; such that the high frequency end of said first dispersive array is more remote from said transducers than is the low frequency end of said first dispersive array, while the low frequency end of said second dispersive array is more remote from said transducers than is the high frequency end of said second dispersive array, while said transducers are oriented relative to each other such that the high frequency ends of said transducers are adjacent each other,
   and said device further comprises,
   input means for providing input pulse to said input transducers of said transmitter means, and
   measuring means coupled to said output transducers of said receiving means for determining the doppler shift produced by said target from the signals provided to said measuring means from said output transducers.

2. A device as claimed in claim 1 wherein said transducers have tapered interdigital fingers.

3. A device as claimed in claim 2 wherein said fingers are hyperbolically tapered fingers.

* * * * *